United States Patent
Lane et al.

(10) Patent No.: US 7,083,855 B2
(45) Date of Patent: Aug. 1, 2006

(54) CONTINUOUS FILAMENT MAT BINDER SYSTEM

(75) Inventors: Adrian C. Lane, Alexandria, PA (US); Jeffrey L. Antle, Canyon, TX (US)

(73) Assignee: Owens Corning Fiberglass Technology, Inc., Summit, IL (US)

( * ) Notice: Subject to any disclaimer, the term of this patent is extended or adjusted under 35 U.S.C. 154(b) by 0 days.

(21) Appl. No.: 10/383,372

(22) Filed: Mar. 7, 2003

(65) Prior Publication Data

US 2003/0211792 A1 Nov. 13, 2003

Related U.S. Application Data

(60) Provisional application No. 60/362,641, filed on Mar. 8, 2002.

(51) Int. Cl.
| | |
|---|---|
| *B32B 27/38* | (2006.01) |
| *B32B 27/04* | (2006.01) |
| *D06M 15/55* | (2006.01) |
| *D06M 15/643* | (2006.01) |
| *C03C 25/10* | (2006.01) |

(52) U.S. Cl. .............. 428/413; 428/297.4; 428/300.1; 428/447; 428/448; 252/8.83; 65/443; 65/447; 65/448; 65/450; 65/451

(58) Field of Classification Search .............. 523/402, 523/404, 414; 428/378, 447; 442/391
See application file for complete search history.

(56) References Cited

U.S. PATENT DOCUMENTS

| | | | |
|---|---|---|---|
| 3,644,166 A | 2/1972 | Gause | |
| 3,936,558 A | 2/1976 | Boken | |
| 3,969,171 A | 7/1976 | Bolen et al. | |
| 4,419,400 A | 12/1983 | Hindersinn | |
| 4,749,614 A | 6/1988 | Andrews et al. | |
| 4,762,750 A * | 8/1988 | Girgis et al. ................. | 428/378 |
| 4,786,528 A | 11/1988 | Amelio et al. | |
| 4,842,667 A | 6/1989 | Thorsted, Jr. | |
| 4,873,128 A | 10/1989 | Ma et al. | |
| 5,214,098 A * | 5/1993 | Setiabudi et al. ........... | 525/109 |
| 5,273,819 A | 12/1993 | Jex | |
| 5,300,547 A * | 4/1994 | Hagenson et al. .......... | 524/188 |
| 5,462,620 A | 10/1995 | Booher | |
| 5,662,776 A | 9/1997 | Ushida et al. | |
| RE36,705 E | 5/2000 | Booher | |
| 6,159,405 A | 12/2000 | Taylor | |
| 6,168,835 B1 * | 1/2001 | Carter et al. ................. | 427/386 |
| 6,185,962 B1 * | 2/2001 | Hartman et al. .............. | 65/447 |
| 6,541,541 B1 * | 4/2003 | Masamune et al. ......... | 523/217 |
| 2004/0034154 A1 * | 2/2004 | Tutin et al. ................. | 524/538 |
| 2005/0025967 A1 * | 2/2005 | Lawton et al. .............. | 428/375 |

FOREIGN PATENT DOCUMENTS

| | | |
|---|---|---|
| WO | WO 00/71343 | 11/2000 |
| WO | WO 01/92002 | 12/2001 |

* cited by examiner

*Primary Examiner*—Michael J. Feely
(74) *Attorney, Agent, or Firm*—Inger H. Eckert; Margaret S. Millikin; Maria C. Gasaway

(57) ABSTRACT

A binder slurry for a continuous filament mat used in a phenolic pultrusion system comprising a phenolic compatible silane, a non-ionic surfactant, a defoamer, water, an organic acid and a bisphenol epoxy powdered resin having a thermally active dicyandiamide cross-linking resin. The binder slurry resin is unique in that the bisphenol epoxy powdered resin having a thermally active dicyandiamide cross-linking resin is compatable with presently available phenolic resins, and as such pultruded parts made have improved surface and mechanical properties as compared with traditional polyester type binder slurries which are not compatable with phenolic resins. Continuous filament mats made with the new binder slurry also may also be made into epoxy prepreg that can be used to make composite parts.

6 Claims, 1 Drawing Sheet

CONTINUOUS FILAMENT MAT BINDER SYSTEM

TECHNICAL FIELD AND INDUSTRIAL APPLICABILITY OF THE INVENTION

The present invention relates generally to continuous filament mats and more specifically to a binder system for a continuous filament mat.

BACKGROUND OF THE INVENTION

Continuous filament mats are widely known and are used as one component in fiber reinforced composite parts.

To make a fiber reinforced phenolic resin part having a continuous filament mat, the continuous filament mat must first be produced. Traditionally, the continuous fiber mat is produced by first introducing a sizing to the continuous glass fiber by known methods. A polyester binder system is then introduced to the sized fiber using a curtain coater or some similar technique to flood the glass fiber. The flooded sized fiber is then dried in an oven to form the continuous filament mat. The mat and a glass roving(s) are then subsequently wetted with a phenolic resin, typically by running the mat and roving through a phenolic resin bath. The wetted mat and glass roving are then introduced into a heated pultrusion die. The die shapes the mat and glass roving into a resin/glass composite that is then cured to form a pultruded part.

One problem with known methods is that the polyester binder materials used to form the continuous filament mats are not fully compatible with the phenolic resins that form the resin matrix. This affects the performance of the composite part.

It is thus highly desirable to make a binder system that is fully compatible with the phenolic resin bath, thereby forming fiber reinforced phenolic resin composite parts having potentially superior performance characteristics.

SUMMARY OF THE INVENTION

One object of the invention is to make a binder system that is fully compatible with the phenolic resin bath, thereby forming fiber reinforced phenolic resin composite part having potentially superior performance characteristics.

The present invention uses a powdered bisphenol epoxy with a thermally active crosslinking agent (dicyandiamide) dispersed into a flooding liquid preferably having a non-ionic surfactant, a silane, a defoaming agent, and water. An organic acid is also added for pH control. The powder binder and flooding liquid act as a system to bind the multiplicity of glass fibers into a mat. As the powdered bisphenol epoxy and thermally active crosslinking agent are compatible with the phenolic resin, as compared with traditional unsaturated polyester binder systems which are not compatible, pultruded parts having improved performance characteristics are realized.

In addition, the continuous filament mat formed in the above process could also be used in an epoxy application using a prepreg type process to form a laminate material that could be subsequently press molded to form a composite laminate part.

Other objects and advantages of the present invention will become apparent upon considering the following detailed description and appended claims, and upon reference to the accompanying drawings.

DETAILED DESCRIPTION OF THE INVENTION

Figure 1:
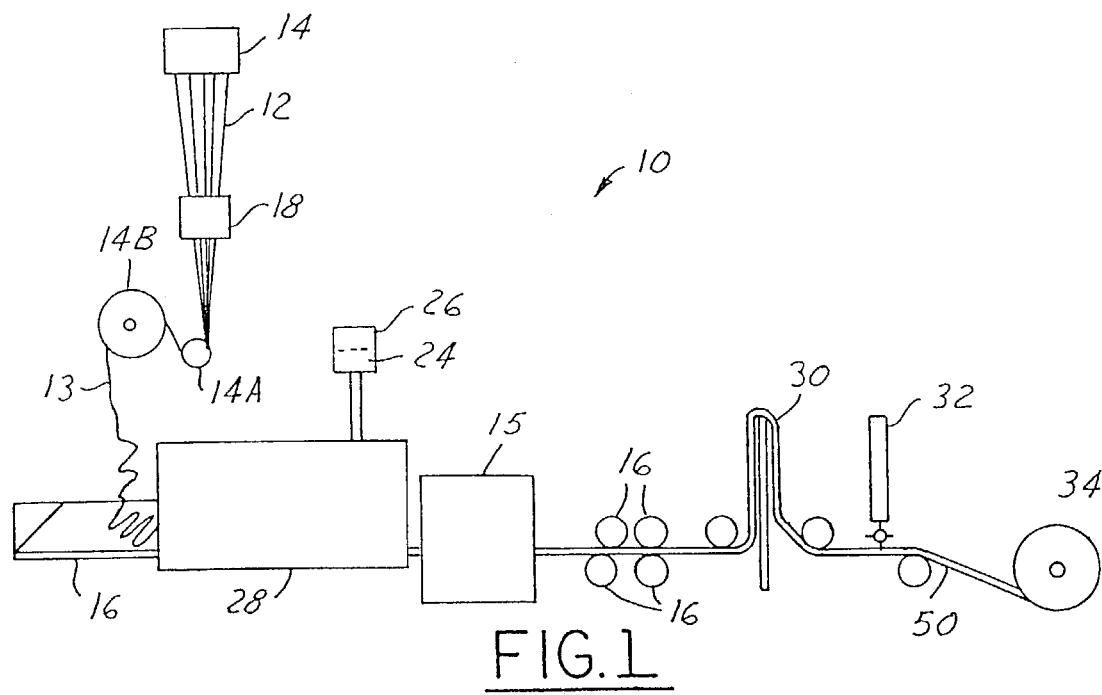
FIG. 1 is a schematic diagram of a process for making a continuous filament mat according to a preferred embodiment of the present invention.

Referring now to FIG. 1, a preferred assembly process for forming a continuous filament mat 50 is generally shown as 10. One or more strands of a continuous filament fiber 12 are formed in a furnace 14 by melting a quantity of glass or other reinforcing material, typically in the form of marbles, in a manner that is well known in the art. A sizing composition 18 is introduced to the one or more strands of fiber 12. The sizing composition 18 preferably contains a phenolic compatible silane and a lubricant that is introduced to the fiber 12 by roll application, dipping, flooding or by any other method that is known in the art. A preferred composition of the sizing composition 18 is listed below in Table 1.

The sized fibers 12 are then formed together into one continuous strand 13 by a pair of pulleys 14A and 14B. The continuous strand 13 may also be split into a multiple number of bundles or splits (n=2–30), and is hereinafter referred to as continuous strand 13 for ease of description. The continuous strand 13 is placed onto a moving belt 16. The continuous strand 13 is then moved along the moving belt 16 and flooded with continuous filament mat ("CFM") binder slurry 24. The CFM binder slurry 24 comprises a powdered polymer binder material with a thermally active cross-linking agent dispersed in water with a small percentage of phenolic compatible silane. An antifoaming agent and dispersant are also typically added to the slurry. A preferred composition of the slurry is listed below in Table 2.

The CFM binder slurry 24 that is formed is then delivered from a sump tank 26 to a curtain coater 28 wherein the mixture floods the continuous strand 13. The excess liquid is removed from the strand 13 by suction. The strands 13 are then transferred to an oven 15 for moisture removal and curing and then pressed in a plurality of presses 16 to form a binded filament mat 50. Preferably, the oven 15 is set between approximately 450–520 degrees Fahrenheit. Upon exiting, the binded filament mats 50 are then slit by a slitter 30, cut to a preferred size by a cutter 32, and rolled onto a cardboard tube 34. The binded filament mats 50 rolled onto the cardboard tube 34 are loaded with the CFM binder in a range of 4–8% of the dry total weight of the binder and matting.

Figure 2:
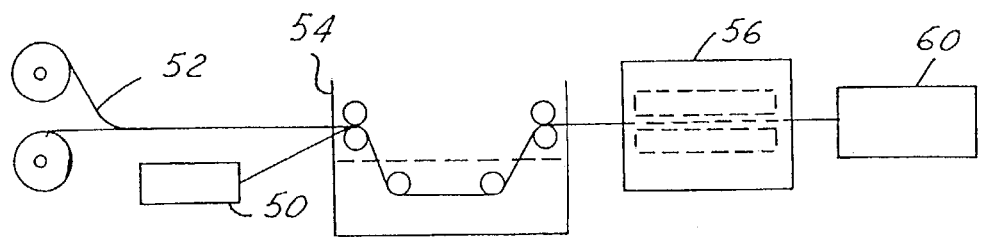
FIG. 2 is a schematic diagram for making a pultruded composite part from the continuous filament mat of FIG. 1 according to a preferred embodiment of the present invention.

The binded mats 50 that are formed above are then available to be combined with a plurality of glass rovings 52 to form a composite phenolic pultruded part 60. This is depicted in FIG. 2. First, the mats 50 and a plurality of glass rovings 52 are dipped through a phenolic bath 54. The phenolic bath 54 that is used is well known in the art and is compatible with the mats 50 having the CFM binder. For example, one preferred phenolic pultrusion resin for use in the phenolic pultrusion bath 30 is Georgia Pacific's 289D17 phenolic resin.

The mats 50 and rovings 52 are then introduced into a heated pultrusion die 56. The heated pultrusion die 56 cures the resin/glass composite into composite part 60. The time and temperature within the heated pultrusion die 56 are to ensure that the composite part 60 formed is fully cured. Preferably, the temperature within the heated pultrusion die 56 is between approximately 375 and 450 degrees Fahrenheit and the time is sufficient to ensure a fully cured part.

In an alternative embodiment, the phenolic bath 54 may be replaced with a urethane bath. The urethane resin composition, like the phenolic resin composition, is compatible with the CFM binder contained within the mat 50. A known urethane system useful in pultrusion includes the Dow Fulcrum technology http://www.dow.com/fulcrum/lit.htm, available from Dow Chemical of Midland, Mich. The curing temperature for the urethane composite part formed within the heated pultrusion die 56 is typically lower than that of the phenolic composite part 56, with preferred temperatures between approximately 250 and 350 degrees Fahrenheit.

Figure 3:
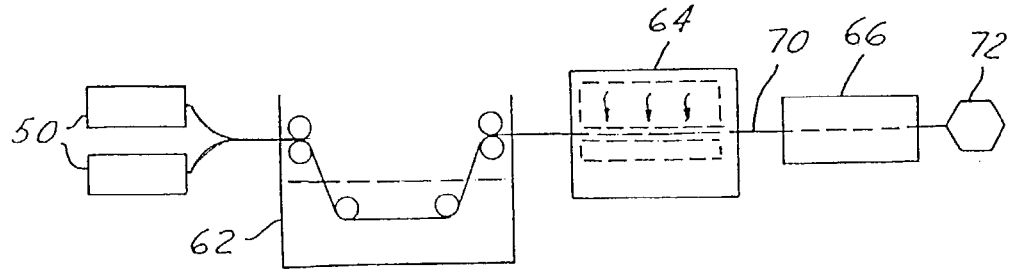
FIG. 3 is a schematic diagram for making an epoxy prepreg tape from the continuous filament mat of FIG. 1 according to another preferred embodiment of the present invention.

In an alternative preferred embodiment, as shown in FIG. 3, an epoxy type prepreg 70 may be produced from the mats 50 formed above. In this process, the fibers 12 are run through the sizing composition 18 and the CFM slurry bath 24 to form the binded mat 50 as described above in FIG. 1. The mats 50 are then dipped in an epoxy bath 62 and prestaged in an oven 64 to form the epoxy prepreg 70. Preferably, the oven 64 is set for between 300 and 400 degrees Fahrenheit and the line speed is set sufficient to cure the epoxy prepreg, typically around 5-10 minutes. The layers of the epoxy prepreg 70 are then pressed together in a press 66 to form a composite part 72. This composite part 72 may be used in a wide variety of applications such as electrical laminates that are well known in the art.

One preferred example of an epoxy bath 62 that may be used in the present invention is discussed in Tables 1 and 2 of G. A. Hunter's 1988 Article "Pultruding Epoxy Resin", presented at the 43$^{rd}$ Annual Conference sponsored by The Society of Plastics Industry, Inc., which is herein incorporated by reference.

Mat and Roving Material

The mat 50 material is preferably a continuous filament glass fiber material. This may include s-type glass fibers or e-type glass fibers, and other commercially available glass fibers that are well known in the art. In the preferred embodiment of the present invention, e-type glass is used.

The roving 52 material is also preferably a continuous filament glass fiber material. This may include s-type glass fibers or e-type glass fibers, and other commercially available glass fibers that are well known in the art. In the preferred embodiment of the present invention, e-type glass is used. In addition, the method for making the glass roving material may include any method that is well known in the art.

Sizing Composition

The sizing composition 18 is made by mixing a phenolic compatible silane in water. The pH of the resultant mixture is then adjusted to between 4 and 6 by adding an acid such as acetic acid. One preferred silane that may be used is a gamma-aminopropyl trimethoxy silane such as Witco-OSI's A-1100. At least one lubricant is added to the resultant mixture and the pH is once again adjusted to between 4 and 6 using acetic acid. Two preferred lubricants are Cirrosol 185AE and 185AN, each manufactured by ICI America. Cirrosol 185AE is a octanoic (caprylic) acid-tetraethylene pentamine condensate solubulized with acetic acid, while 185AN is a nonanoic (pe/argonic) acid-tetraethylene pentamine condensate solubulized with acetic acid. A preferred sizing composition 18 is shown below in Table 1:

TABLE 1

SIZING COMPOSITION 18

| Materials | MIX Quantity | | 1000 gallon | |
|---|---|---|---|---|
| | MIN. | NOM. | MAX. |
| First Water | 932 gal. | 981 gal. | 1030 gal. |
| Acetic Acid | 9.03 lbs. | 9.50 lbs. | 9.98 lbs. |
| A-1100 Silane | 9.03 lbs. | 9.50 lbs. | 9.98 lbs. |
| Cirrasol 185AE | 1.43 lbs. | 1.50 lbs. | 1.58 lbs. |
| Cirrasol 185AN | 0.67 lbs. | 0.70 lbs. | 0.74 lbs. |
| Water for Cirrasol | 3.6 lbs. | 4.0 lbs. | 4.4 lbs. |
| Water For Acid | 560 mls. | 650 mls. | 740 mls. |
| Acetic Acid for Cirrasol | 340 mls. | 350 mls. | 360 mls. |

CFM Binder Slurry

Current binder materials use unsaturated polyester binders that have shown unacceptable performance in phenolic pultrusion systems. It is believed that the polyester binders do not provide a compatible interface with the phenolic binder resins. The CFM binder system of the present invention solves this problem by providing a compatible interface.

The CFM binder slurry 24 is prepared by dispersing a powdered polymer resin having a thermally active cross-linking agent in water. One preferred powdered polymer resin having a thermally active cross-linking agent is a bisphenol type epoxy resin with a thermally active dicyandiamide cross-linking agent such as Pretex 110, manufactured by Reichold. One or more non-ionic surfactants are typically added as a dispersant and as a defoamer. Also, a phenolic compatible silane is added to the resultant mixture. Preferably, this silane is Witco-OSI's A-1100 silane. Finally, the pH is adjusted to between 4 and 6 using acetic acid. A preferred composition of the CFM binder slurry is shown below in Table 2:

TABLE 2

CFM BINDER SLURRY 24

| MATERIAL | ACTIVE NON-VOLATILE SOLIDS AS RECEIVED | PERCENT BY WEIGHT AS RECEIVED | 1000 GALLON MIX |
|---|---|---|---|
| Pretex 110 | 100 | 1.32% | 110 |
| Triton X-100 | 100 | 0.010% | 0.8 |
| Acetic acid | | 0.37% | 30.6 |
| A-1100 | 58 | 0.37% | 30.6 |
| Foamex AD-300 | 50 | 0.010% | 0.8 |
| WATER | | 97.93% | 8157 |
| Total weight | | 100.0% | 8330 |
| MIX SOLIDS | | | 1.55% |

While the invention has been described in terms of preferred embodiments, it will be understood, of course, that the invention is not limited thereto since modifications may be made by those skilled in the art, particularly in light of the foregoing teachings.

What is claimed is:

1. A continuous filament mat, comprising:
   at least one strand el-containing multiple continuous filament fibers;
   a sizing composition on said multiple continuous filament fibers, said sizin2 composition including a phenolic compatible silane and a lubricant; and a binder on said sized multiple continuous filament fibers, said binder including a phenolic compatible silane, a bisphenol epoxy powdered resins and a thermally active dicyandiamide cross-linking resin.

2. The continuous filament mat of claim 1 wherein said phenolic compatible silane in said sizing composition is gamma-aminopropyl trimethoxy silane.

3. The continuous filament mat of claim 1, wherein said binder comprises from 4 to 8 percent dry total weight of said continuous filament mat.

4. A continuous filament mat comprising:
at least one strand formed of continuous filament fibers having thereon a sizing composition and a binder, said continuous filament fibers being at least first partially coated with said sizing composition during the formation of said continuous filament fibers and then at least partially coated with said binder composition;
wherein said sizing composition includes a phenolic compatible silane and a lubricant and said binder includes a phenolic compatible silane, a bisphenol epoxy powdered resin, and a thermally active dicyandiamide cross-linking resin.

5. The continuous filament mat of claim 4, wherein said phenolic compatible silane in said sizing composition is gamma-aminopropyl trimethoxy silane.

6. The continuous filament mat of claim 4, wherein said binder comprises from 4 to 8 percent dry total weight of said continuous filament mat.

* * * * *

UNITED STATES PATENT AND TRADEMARK OFFICE
CERTIFICATE OF CORRECTION

PATENT NO. : 7,083,855 B2
APPLICATION NO. : 10/383372
DATED : August 1, 2006
INVENTOR(S) : Lane It is certified that error appears in the above-identified patent and that said Letters Patent is hereby corrected as shown below:

Claim 1, Column 4, Line 63 - Should read "strand containing"
Claim 1, Column 4, Line 66 - Should read "sizing composition"

Signed and Sealed this

Twelfth Day of December, 2006

JON W. DUDAS
*Director of the United States Patent and Trademark Office*